United States Patent [19]

Holleran et al.

[11] Patent Number: 4,714,687

[45] Date of Patent: Dec. 22, 1987

[54] GLASS-CERAMICS SUITABLE FOR DIELECTRIC SUBSTRATES

[75] Inventors: Louis M. Holleran, Elmira; Francis W. Martin, Painted Post, both of N.Y.

[73] Assignee: Corning Glass Works, Corning, N.Y.

[21] Appl. No.: 923,432

[22] Filed: Oct. 27, 1986

[51] Int. Cl.[4] .................... C03C 10/04; C03C 10/08; C03C 3/085; C03C 3/062

[52] U.S. Cl. ........................................ 501/9; 501/5; 501/69; 501/73

[58] Field of Search .................. 501/4, 5, 8, 9, 69, 501/73

[56] References Cited

U.S. PATENT DOCUMENTS

| | | | |
|---|---|---|---|
| 3,460,967 | 8/1969 | Petticrew | 65/30.1 |
| 3,460,987 | 8/1969 | McMillan et al. | 501/70 |
| 3,681,097 | 8/1972 | Beall et al. | 501/69 |
| 3,681,102 | 8/1972 | Beall | 501/69 |
| 3,854,963 | 12/1974 | Rittler | 501/69 |
| 3,951,699 | 4/1976 | Melmendier et al. | 501/4 |
| 4,078,939 | 3/1978 | Schwochow et al. | 501/69 |
| 4,199,340 | 4/1980 | Topping et al. | 65/32 |
| 4,256,796 | 3/1981 | Hang et al. | 501/5 |
| 4,358,541 | 11/1982 | Andrus et al. | 501/5 |
| 4,385,127 | 5/1983 | Chyung | 501/5 |

*Primary Examiner*—Mark L. Bell
*Attorney, Agent, or Firm*—C. S. Janes, Jr.

[57] ABSTRACT

This invention is directed to the production of glass-ceramic materials especially designed for substrates in integrated circuit packaging. The glass-ceramics can be prepared from thermally crystallizable glasses that can be sintered into an integral glass-ceramic having a dielectric constant less than 6 and containing willemite as the predominant crystal phase. The overall composition of the glass-ceramic consists essentially, in weight percent of 15–45% ZnO, 10–30% $Al_2O_3$, and 30–55% $SiO_2$. Where desired, a nucleating agent selected from the group consisting of 8–12% $ZrO_2$ and 0.001–0.05% of a noble metal selected from the group consisting of Au, Pd, and Pt may be included.

9 Claims, No Drawings

GLASS-CERAMICS SUITABLE FOR DIELECTRIC SUBSTRATES

BACKGROUND OF THE INVENTION

Real progress in electronics has been paced by improvements in the basic active electronic device, viz., the transistor, and in the ability to pack ever-increasing numbers of them onto a single silicon or gallium arsenide wafer or chip. Performance of these active devices (or integrated circuits) requires them to be electrically connected to other devices and eventually to an operating medium. These devices must also be protected from overheating, from physical abuse, and from the environment. The necessary connections and protection are provided by encasing the active devices in a package. That package interconnects and supports the chip while providing protection thereto.

The greatest volumes of integrated circuits produced today are contained in organic plastic packages. However, for high reliability, long life applications, hermetically sealed ceramic packages are employed. Most frequently, alumina ($Al_2O_3$) and alumina multilayer packages have been utilized for such applications.

As the integrated circuit device grows in complexity, more and more active elements being packaged onto a chip, a higher proportion of the system signal response time is required to transmit signals between chips or to and from the operating application. The ideal unit would place the entire system on a single chip and eliminate or minimize off chip signals. That assembly has not been successfully produced.

Increased interconnect signal speed and integrity can be achieved by shortening the signal path between chips, by using a ceramic material having improved electrical properties, viz., a lower dielectric constant and a lower dissipation factor, and by lowering the resistance of the signal conductor and reducing noise. The closer spacing of chips requires very fine and closely-spaced signal lines and multi-layer packages with fine internal connections (vias). The combination of surface smoothness and flatness with close dimensional control becomes extremely critical for satisfactory fine line metallization and via registration. Whereas $Al_2O_3$ substrates and multilayer packages can be ground to a smooth flat surface, the high thermal shrinkage of $Al_2O_3$ ($\sim 18\%$), coupled with difficulty in machining, present problems in achieving high density via and pad registration. The relatively high dielectric constant of $Al_2O_3$ at ambient temperature ($\sim 9$-$10$) restricts the ability to closely space signal lines (cross talk, noise results), and also slows the speed of the signal itself.

Another major drawback in the use of $Al_2O_3$ multilayer packages is the need for utilizing highly refractory metals such as molybdenum or tungsten for metallization because of the high firing temperature required for sintering $Al_2O_3$ ($\geq 1500°$ C). Whereas their electrical resistivities are relatively low, they are significantly higher than silver, copper, or gold, and, of course, molybdenum and tungsten require gold plating prior to soldering.

Accordingly, the objective of the present invention was to develop a new substrate material for a multilayer package exhibiting properties superior to those of $Al_2O_3$ for that application; those properties including a lower dielectric constant ($<6$), a sintering temperature no higher than 1000° C., a smooth flat surface without additional processing, and improved dimensional control for location of vias and pads.

SUMMARY OF THE INVENTION

I have found that the above objective can be achieved through the use of a glass-ceramic containing willemite ($2ZnO.SiO_2$) as the predominant crystal phase for the substrate material.

Willemite has long been recognized as exhibiting good dielectric properties, but has not been employed in producing electronic substrates because of its high content of ZnO (73.1% by weight ZnO, 26.9% $SiO_2$). Such high ZnO contents are not only costly but, more importantly, volatilization of zinc becomes a very significant problem and control of crystallization can be formidable. I have found, however, a group of glass compositions containing a moderate level of ZnO which, upon heat treatment for relatively brief periods, e.g., 10 minutes to 2 hours, at temperatures 875°-1000° C. (preferably >900° C.), will be converted into glass-ceramic bodies of high crystallinity wherein willemite constitutes the predominant, and sometimes sole, crystal phase. Such glass compositions consist essentially, expressed in terms of weight percent on the oxide basis, of about 15–45% ZnO, 10–30% $Al_2O_3$, and 30–55% $SiO_2$. Up to 5% $B_2O_3$, up to 5% CaO and/or SrO and/or BaO and/or PbO, up to 7% $Cs_2O$, up to 15% MgO, and up to 15% MnO may optionally be present; the total of all such optional ingredients not exceeding 15%. Those additions may lead to greater levels of crystallization and/or lower temperatures for sintering and/or heat treatment. The inclusion of at least 3% MgO is especially desirable in that regard; the presence of MgO can result in the generation of cordierite ($2MgO.2Al_2O_3.5SiO_2$) as a secondary crystal phase. The zinc spinel, gahnite, ($ZnO.Al_2O_3$) may also be developed in small amounts. The smaller alkali metal oxides $Li_2O$, $Na_2O$, and $K_2O$ will be essentially absent from the compositions in order to avoid undue fluxing and to insure securing the desired electrical properties. It will be appreciated that certain ions such as $Mg^{+2}$ and $Mn^{+2}$ may enter into the willemite structure to form a solid solution. Therefore, as used herein, the term willemite includes such solid solutions. $Ca^{+2}$, $Sr^{+2}$, $Pb^{+2}$, $Ba^{+2}$, and $Cs^{+1}$ ions are too large to enter the willemite crystal structure. Their presence may improve the sintering character of the glass by retarding early crystallization of $\beta$-quartz phases. However, in all cases the amounts included will be so small that they will be incorporated into the structure of cordierite crystals co-precipitated with the willemite. Hence, substantial concentrations thereof lead to the growth of unwanted crystal phases.

The capability of varying the identity of the crystal phases in the final product permits the close tailoring of the properties exhibited thereby. For example, the linear coefficient of thermal expansion (0°-300° C.) can be designed to be compatible with silicon ($35$-$45 \times 10^{-7}/°C.$). The dielectric constants of the inventive materials at ambient temperature range between 5–6 and thermal shrinkage of the inventive materials can be better controlled from lot-to-lot, since the starting batch material therefor, i.e., a glass, provides a more homogeneous, uniform composition. And, because a glass-ceramic is formed through the heat treatment of a parent glass body which crystallizes the glass in situ, the surfaces of the glass-ceramic body can be smooth and flat as made; i.e., no subsequent machining is necessary.

The inventive glass-ceramics can be prepared in bulk form in the conventional manner, i.e., according to the following three general steps: first, a glass-forming batch, customarily containing a nucleating agent, is melted; second, that melt is cooled below the transformation range thereof and simultaneously a glass body of a desired configuration is shaped therefrom; and, third, that glass body is exposed to a predetermined heat treatment (875°–1000° C.) to cause the glass body to crystallize in situ. Operable nucleating agents include 8–12% $ZrO_2$ and 0.001–0.05% of a noble metal such as Au, Pd, and Pt. The use of $TiO_2$ as a nucleating agent leads to the growth of gahnite rather than willemite.

The inventive glass-ceramics can also be prepared without the inclusion of a nucleating agent. In this process the glass resulting from the second step of the above method is comminuted to a fine powder, and that powder fired at temperatures between 875°–1000° C. to sinter the particles into an integral body, e.g., a sheet or film, and, concurrently, to cause the glass to crystallize in situ. Nucleating is provided by the surfaces of the powdered glass particles.

This second process is of special utility with respect to forming integrated circuit packages. Thus, the finely-divided glass particles (commonly having diameters of less than 10 microns) can be cast and bonded into tapes which, in turn, can be laid up and the resultant assembly fired at 875°–1000° C. to form a glass-ceramic substrate of a desired thickness.

Several mechanisms have been posited to explain the development of a willemite crystal phase in the inventive glass-ceramics even though the ZnO concentrations therein are far below 73.1%. To illustrate: First, it is known that $Mg^{+2}$ and $Mn^{+2}$ ions can substitute for $Zn^{+2}$ ions in the willemite structure. Second, $Al_2O_3$ may replace the combination of ZnO and $SiO_2$; i.e., $Al_2O_3$ may substitute for $SiO_2+ZnO$ with the same number of oxygen atoms and same charge balance. $Al_2O_3+B_2O_3$ may react with $2SiO_2+2ZnO$, with $B^{+3}$ ions replacing $Si^{+4}$ ions and $Al^{+3}$ ions replacing $Zn^{+2}$ ions. The possibility of replacing $2Zn^{+2}$ ions with a $Si^{+4}$ ion plus a cation vacancy has also been theorized. That replacement would obviously introduce a local charge imbalance, but it is believed that such condition could be tolerated to some extent.

Each of those mechanisms would give rise to willemite solid solution wherein the overall X-ray diffraction pattern displays the general character of willemite, but wherein the peaks are shifted slightly and the intensities modified somewhat. It is conjectured that some combination of those mechanisms could quite conceivably lead to greater crystallinity than would normally be anticipated. The glassy phase remaining would be in the so-called cabal area of glass formation where diffusion of cations is very difficult and excellent electrical resistivity and dielectric behavior are observed.

PRIOR ART

U.S. Pat. No. 3,460,967 is directed to a method for enhancing the cathodoluminescent brightness of a glass screen having a surface-crystallized layer of glass containing an in situ-formed phosphor. Several base glass systems of different compositions were stated to be operable. One such base system yielded products having a surface-crystallized layer containing a phosphor composed of a zinc silicate or zinc silicate-type crystal activated with divalent manganese. That base system consisted essentially, in weight percent, of:

| | | | |
|---|---|---|---|
| $SiO_2$ | 40–60 | MgO | 0–10 |
| $Al_2O_3$ | 5–15 | MgO + CaO + SrO + BaO | 6–36 |
| ZnO | 15–35 | $Na_2O$ | 0–8 |
| CaO | 0–24 | $K_2O$ | 0–8 |
| BaO | 0–20 | $Li_2O$ | 0–2 |
| SrO | 0–10 | $K_2O + Na_2O + Li_2O$ | <8 |
| where $Na_2O + K_2O + Li_2O = 0$, then $CaO + BaO + SrO > 6$ | | | |

This inventive method involved contacting the crystallized surface layer with a solution of $NH_4OH$ or an alkali metal hydroxide at an elevated temperature for a sufficient period of time to partially leach the surface layer. No mention was made of substrates for use in integrated circuit packages. $Li_2O$, $Na_2O$, and $K_2O$ are essentially absent from the present inventive compositions, whereas those constituents are included in the working examples of the patent. Inasmuch as $Li_2O$, $Na_2O$, and $K_2O$ are absent from the present inventive compositions, the minimum level of $CaO+SrO+BaO$ required in the patent is greater than the 5% maximum of those three components that can be tolerated in the present inventive compositions. No working example provided in the patent falls within the ranges of components required in the present inventive compositions.

U.S. Pat. No. 3,460,987 describes the formation of articles consisting of an interior refractory conductive body (desirably carbon) and a glass-ceramic coating thereon. One group of operable coatings consisted essentially, in weight percent, of:

| | | | |
|---|---|---|---|
| $SiO_2$ | 16–32 | $K_2O$ | 0–6 |
| $Al_2O_3$ | 12–16 | MgO | 0–10 |
| ZnO | 43–47 | CaO | 0–10 |
| $B_2O_3$ | 10–25 | SrO | 0–10 |
| $Li_2O$ | 0–6 | BaO | 0–10 |
| $Na_2O$ | 0–6 | | |

No reference is made to the use of such material as substrates for integrated circuit packages and the concentrations of $B_2O_3$ exceed the maximum that can be tolerated in the present inventive compositions.

U.S. Pat. No. 3,681,097 is drawn to the production of glass-ceramic articles demonstrating very low coefficients of thermal expansion, i.e., $-5$ to $+22\times10^{-7}$/°C. over the range of 25°–600° C., wherein the crystal phase is selected from the group of zinc petalite solid solution and β-quartz solid solution. The compositions therefor are essentially free from alkali metal oxides, MgO, CaO, and SrO, and consist essentially, in weight percent, of 13–40% ZnO, 9–26% $Al_2O_3$, 40–75% $SiO_2$, and a nucleating agent selected from the group of 3–10% $ZrO_2$ and 0.001–0.5% of a noble metal. No suggestion is made of substrates for use in integrated circuit packages and the presence of willemite is unequivocally eschewed as rendering the resultant product unacceptable for the utility desired.

U.S. Pat. No. 3,681,102 discloses the preparation of transparent glass-ceramic articles wherein the zinc spinel, gahnite, is the predominant crystal phase. The compositions therefor consist essentially, in weight percent, of 2–20% ZnO, 8–25% $Al_2O_3$, 55–75% $SiO_2$, and 2–12% $ZrO_2$. Up to 5% MgO may be included to enter into the crystal structure to yield a zinc spinel solid solution $(Zn,Mg)Al_2O_4$. Up to 10% total of BaO, CaO, SrO, $K_2O$, $Rb_2O$, and $Cs_2O$, and up to 5% total of $Li_2O$, $Na_2O$, $B_2O_3$, and $TiO_2$ may also be present. Heat treating temperatures of 1000°–1200° C. are employed. No reference is made to substrates for use in integrated circuit packages or to willemite. The $SiO_2$ content is greater than can be tolerated in the present inventive compositions and there is no proscription against the inclusion of $Li_2O$, $Na_2O$, and $K_2O$ and no affirmance of the need to maintain the presence of CaO, SrO, and/or BaO at a low level.

U.S. Pat. No. 3,854,963 is concerned with the production of glass-ceramic articles wherein the predominant crystal phase is selected from the group of zinc petalite and $\beta$-quartz solid solutions. The compositions therefor were essentially free from alkali metal oxides, MgO, CaO, and SrO, and consist essentially, in weight percent, of 10-20% ZnO, 10-20% $Al_2O_3$, 50-75% $SiO_2$, and at least 0.1% AgCl as nucleating agent. In like manner to U.S. Pat. No. 3,681,097 above, no mention is made to substrates for use in integrated circuit packages and the presence of willemite is expressly avoided.

U.S. Pat. No. 3,951,669 is related to the preparation of glass-ceramic materials wherein the crystal phase consists of a zinc beta-quartz solid solution. The materials are used as fillers in certain sealing glasses to reduce the overall coefficient of thermal expansion of the sealing glass. The compositions therefor consisted essentially, in weight percent, of 45-65% $SiO_2$ and at least 35% $ZnO+Al_2O_3$, wherein ZnO and $Al_2O_3$ are present in molar ratios between 0.9-1.1. There is no suggestion of substrates for integrated circuit packaging and willemite is nowhere referred to.

U.S. Pat. No. 4,199,340 discusses the formation of glass-ceramic-to-metal seals, the base compositions of the glass-ceramic materials consisting essentially, in weight percent, of 25-32% ZnO, 2.5-10% $Al_2O_3$, and 30-60% $SiO_2$. Normally, one or more of the following is also included in the composition:

| CaO | 0-10 | $Li_2O$ | 0-10 |
|---|---|---|---|
| PbO | 0-14.5 | $Na_2O$ | 0-3 |
| $P_2O_5$ | 0-2.5 | $K_2O$ | 0-3 |
| $ZrO_2$ | | | 0-12.5 |

Nothing is said about substrates for integrated circuit packaging, willemite is not referred to, the $Al_2O_3$ content is generally lower than the minimum required in the present inventive compositions, and there is no proscription against the inclusion of $Li_2O$, $Na_2O$, and $K_2O$, and no affirmance of the need to maintain the presence of CaO at a low level.

U.S. Pat. No. 4,256,796 refers to glass-ceramic coatings for application to metal substrates leading to the fabrication of electronic circuit boards. The compositions for such coatings consist essentially, in weight percent, of

| BaO | 16-50 | $SiO_2$ | 10-23 |
|---|---|---|---|
| MgO | 16-42 | $ZrO_2$ | 0-5 |
| CaO | 0-11 | $Al_2O_3$ | 0-5 |
| ZnO | 0-11 | $SnO_2$ | 0-5 |
| CaO + ZnO | 0-11 | $ZnO_2 + Al_2O_3 + SnO_2$ | 0-5 |
| $B_2O_3$ | 12-34 | | |

The concentrations of BaO, MgO, and $B_2O_3$ are higher than can be tolerated in the compositions of the present invention and the levels of ZnO, $Al_2O_3$, and $SiO_2$ are too low.

U.S. Pat. No. 4,358,541 is directed to glass-ceramic coatings especially suitable for application to metal substrates. The compositions of those coatings are free from alkali metal oxides and consist essentially, in weight percent, of:

| MgO | 5-35 | $SiO_2$ | 25-50 |
|---|---|---|---|
| CaO | 0-35 | $Al_2O_3$ | 0-10 |
| ZnO | 0-25 | $B_2O_3$ | 0-25 |
| CaO + ZnO | 10-35 | $P_2O_5$ | 0-10 |
| $B_2O_3 + P_2O_5$ | | 4-25 | |

Where CaO is present, the predominant crystal phase is diopside and akermanite; where CaO is absent, the three phases magnesium borate, willemite, and enstatite ($MgO \cdot SiO_2$) will be present. There is no discussion of the need for willemite to constitute the predominant crystal phase, $Al_2O_3$ is merely an optional ingredient in amounts generally less than those required in the present inventive compositions, and there is no statement that CaO should be held at a low level.

U.S. Pat. No. 4,385,127 describes the preparation of glass-ceramic coatings particularly applicable for use on metal substrates. The compositions of those coatings are free from alkali metal oxides and consist essentially, in weight percent, of:

| BaO | 10-60 | $Al_2O_3$ | 0-15 |
|---|---|---|---|
| $B_2O_3$ | 5-30 | CaO | 0-15 |
| $SiO_2$ | 25-40 | ZnO | 0-16 |
| MgO | 10-35 | $Al_2O_3$ + CaO + ZnO | 5-20 |

Nowhere is willemite noted as being crystallized from those compositions, the ZnO content is generally below that required in the present inventive compositions, and the BaO and $B_2O_3$ contents are generally too high.

DESCRIPTION OF PREFERRED EMBODIMENTS

Table I records a number of precursor glass compositions, expressed in terms of parts by weight on the oxide basis, illustrating various aspects of the present invention. Inasmuch as the sum of the individual constituents totals or closely approximates 100, for all practical purposes the reported values can be considered to reflect weight percent. The actual batch ingredients may comprise any materials, either oxides or other compounds, which, when melted together, will be converted into the desired oxide in the proper proportions.

The components for each of the exemplary compositions listed in Table I were compounded, ballmilled together to assist in obtaining a homogeneous melt, charged into platinum crucibles, and lids placed thereupon. The crucibles were introduced into a furnace operating at about 1650° C., and the batches melted for about 6 hours. The melts were poured into a steel mold to form glass slabs having dimensions of about 8"×4×0.5" and that slab was immediately moved to an annealer operating at 700° C. The casting of the melts into slabs permits the inspection of glass quality. Also, specimens can be cut therefrom with a diamond saw for use in testing for various physical properties. Where finely-divided particles are desired, the molten glass can be poured as a thin stream into a bath of tap water, a practice termed "drigaging" in the glass art. The resulting glass particles are dried and comminuted to a predetermined grain size.

Whereas the following examples reflect laboratory work, it must be appreciated that the compositions recited in Table I could be scaled up to be used in commercial glassmaking facilities. Although no fining agent, such as $As_2O_3$ and/or $Sb_2O_3$, was employed in the laboratory melts, an inclusion of a fining agent may be useful to secure optimum glass quality in commercial production.

TABLE I

|  | 1 | 2 | 3 | 4 | 5 | 6 | 7 |
|---|---|---|---|---|---|---|---|
| ZnO | 37 | 37 | 38 | 37 | 35 | 40 | 26.5 |
| $Al_2O_3$ | 14 | 14 | 14 | 14 | 14 | 16.72 | 22.2 |
| $SiO_2$ | 49 | 49 | 47 | 45 | 47 | 39.28 | 42.4 |
| MnO | — | — | 1 | — | — | — | — |
| MgO | — | — | — | 2 | 4 | 4 | 8.8 |
| $B_2O_3$ | — | — | — | 2 | — | — | — |
| Pd | 0.01 | — | — | — | — | — | — |

|  | 8 | 9 | 10 | 11 | 12 | 13 | 14 |
|---|---|---|---|---|---|---|---|
| ZnO | 26.6 | 39.9 | 39.0 | 46.2 | 26.1 | 25.5 | 22.7 |
| $Al_2O_3$ | 19.4 | 16.7 | 14.3 | 12.9 | 24.5 | 24.7 | 22.7 |
| $SiO_2$ | 44.1 | 39.2 | 38.5 | 35.9 | 40.8 | 39.3 | 43.4 |
| MgO | 9.9 | 6.6 | 7.2 | 5.1 | 8.6 | 8.4 | 11.2 |

|  | 15 | 16 | 17 | 18 | 19 | 20 | 21 |
|---|---|---|---|---|---|---|---|
| ZnO | 18.5 | 26.6 | 37.7 | 37.4 | 38.0 | 37.0 | 38.7 |
| $Al_2O_3$ | 23.2 | 23.3 | 17.8 | 17.6 | 17.8 | 17.4 | 18.1 |
| $SiO_2$ | 44.4 | 42.0 | 37.6 | 34.5 | 35.0 | 34.1 | 35.6 |
| MgO | 13.8 | 8.8 | 8.8 | 6.2 | 6.3 | 6.1 | 6.4 |
| $B_2O_3$ | — | 0.2 | 0.3 | — | — | — | — |
| PbO | — | — | — | 4.3 | — | — | — |
| BaO | — | — | — | — | 3.0 | — | — |
| $Cs_2O$ | — | — | — | — | — | 5.3 | — |
| CaO | — | — | — | — | — | — | 1.1 |

The glass slab of Example 1 was crystallizd in situ by heat treating for two hours at 960° C. An x-ray diffraction analysis of the crystallized sample showed peaks typical of willemite. Dielectric properties at various temperatures and frequencies were measured on the crystallized product of Example 1 and the results of those measurements are recorded below in Table II. Electrical resistivity is tabulated in terms of Log $\rho$, dielectric constant as D.C., and dissipation factor as D.F.

TABLE II

|  | 32° C. | 32° C./Hz | 32° C./ 1 KHz | 32° C./ 10 KHz | 32° C./ 100 KHz |
|---|---|---|---|---|---|
| Log $\rho$ | 0.0 | — | — | — | — |
| D.C. | — | 5.17 | 5.15 | 5.15 | 5.15 |
| D.F. | — | 0.0050 | 0.0007 | 0.0006 | 0.0009 |
|  | 147° C. | 147° C./Hz | 147° C./ 1 KHz | 147° C./ 10 KHz | 147° C./ 100 KHz |
| Log $\rho$ | 13.48 | — | — | — | — |
| D.C. | — | 5.22 | 5.20 | 5.20 | 5.20 |
| D.F. | — | 0.0061 | 0.0010 | 0.0006 | 0.0005 |
|  | 197° C. | 197° C./Hz | 197° C./ 1 KHz | 197° C./ 10 KHz | 197° C./ 100 KHz |
| Log $\rho$ | 12.04 | — | — | — | — |
| D.C. | — | 5.28 | 5.24 | 5.22 | 5.23 |
| D.F. | — | 0.0336 | 0.0051 | 0.0014 | 0.0007 |
|  | 247° C. | 247° C./Hz | 247° C./ 1 KHz | 247° C./ 10 KHz | 147° C./ 100 KHz |
| Log $\rho$ | 10.90 | — | — | — | — |
| D.C. | — | 5.69 | 5.30 | 5.26 | 5.75 |
| D.F. | — | 0.5625 | 0.0343 | 0.0057 | 0.0156 |

The glass slabs of the other Examples were comminuted to pass through a No. 200 United States Sieve (74 microns), dry pressed into button-shaped specimens having a diameter of 0.5" and a height of 0.25", and heat treated at various temperatures. When substantial concentrations of MgO were incorporated into the compositions, x-ray diffraction analyses indicated the development of cordierite ($2MgO.2Al_2O_3.5SiO_2$) as a secondary crystal phase. As was explained above, it has been conjectured that the $Pb^{+2}$, $Ba^{+2}$, $Ca^{+2}$, and $Cs^+$ ions in Examples 11-14 are incorporated into the lattice of the cordierite crystals, although that theory has not been rigorously proved. It has further been hypothesized that, because the ionic radius of the $Cs^+$ ions is compatible with the large cavity in the cordierite crystal structure, the presence of $Cs^+$ ions may stabilize the cordierite structure.

X-ray diffraction analysis of the button-shaped sample of Example 2 after heat treatment at 915° C. for two hours evidenced a variation in the normal willemite pattern. In particular, the peak at about 3.48 Å was much enhanced over the typical peaks at about 2.85 Å and 2.33 Å. It has been posited that this shift may be due to the development of a small amount of a $\beta$-quartz phase or $\beta$-zinc silicate. $\beta$-zinc silicate has been observed on heating hemimorphite, a hydrous zinc silicate to 750° C. $\beta$-zinc silicate has a prominent X-ray peak at 3.55 Å. At about 960° C. $\beta$-zinc silicate transforms to zinc orthosilicate, i.e., willemite.

When a button-shaped specimen of Example 3 was heat treated at 915° C. for two hours, it exhibited an orange fluorescence when exposed to radiation having a wavelength of 2537 Å; but when a similar button-shaped sample was heat treated for two hours at 980° C., it demonstrated the green fluorescence typical of willemite when subjected to radiation of 2537 Å wavelength.

The addition of $B_2O_3$ and/or MgO to the base ZnO-$Al_2O_3$-$SiO_2$ composition system results in the development of crystals displaying the typical X-ray diffraction pattern of willemite at lower temperatures and/or shorter times. Examples 4 and 5 are illustrative of that phenomenon; button-type specimens thereof exhibit the X-ray diffraction pattern typical of willemite after a heat treatment of two hours at 915° C.

As observed above, the addition of substantial amounts of MgO can lead to the generation of an additional crystal phase, cordierite, thereby resulting in an overall greater degree of crystallization. Table III records the relative peak heights observed in the X-ray diffraction patterns exhibited by button-type samples prepared from Examples 6-11 after heat treatment for two hours at 915° C. and two hours at 980° C.

TABLE III

| Crystal Phase | X-ray Peak | Example 6 Heat Treatment 915° C.-2 hours | Example 7 Heat Treatment | |
|---|---|---|---|---|
|  |  |  | 915° C.- 2 hrs. | 980° C.-2 hrs. |
| Willemite | 3.48 | 628 | 1083 | 446 |
|  | 2.84 | 626 | 953 | 834 |
|  | 2.33 | 295 | 412 | 359 |
| Cordierite | 3.14 | 364 | 650 | 572 |
|  | 3.02 | 320 | 834 | 592 |
| Gahnite | 2.447 | 214 | 119 | 223 |

| Crystal Phase | X-ray Peak | Example 8 Heat Treatment | |
|---|---|---|---|
|  |  | 915° C.-2 hours | 980° C.-2 hours |
| Willemite | 3.48 | 917 | 560 |
|  | 2.84 | 889 | 852 |
|  | 2.33 | 421 | 420 |
| Cordierite | 3.14 | 660 | 700 |
|  | 3.02 | 642 | — |
| Gahnite | 2.447 | 137 | 183 |

| Crystal Phase | X-ray Peak | Example 9 Heat Treatment | |
|---|---|---|---|
|  |  | 915° C.-2 hours | 980° C.-2 hours |

TABLE III-continued

| Willemite | 3.48 | 860 | 1191 |
|---|---|---|---|
|  | 2.84 | 1114 | 1516 |
|  | 2.33 | 519 | 740 |
| Cordierite | 3.14 | 405 | 505 |
|  | 3.02 | 519 | 704 |
| Gahnite | 2.447 | 88 | 162 |

| Crystal Phase | X-ray Peak | Example 10 Heat Treatment | |
|---|---|---|---|
|  |  | 915° C.-2 hours | 980° C.-2 hours |
| Willemite | 3.48 | 1768 | 991 |
|  | 2.84 | 1361 | 1430 |
|  | 2.33 | 619 | 671 |
| Cordierite | 3.14 | 141 | 357 |
|  | 3.02 | 124 | 471 |
| Gahnite | 2.447 | 0 | 162 |

| Crystal Phase | X-ray Peak | Example 11 Heat Treatment | |
|---|---|---|---|
|  |  | 915° C.-2 hours | 980° C.-2 hours |
| Willemite | 3.48 | 2011 | 1148 |
|  | 2.84 | 1508 | 1585 |
|  | 2.33 | 746 | 838 |
| Cordierite | 3.14 | 120 | 346 |
|  | 3.02 | 100 | 419 |
| Gahnite | 2.447 | 0 | 127 |

A multilayer, ceramic integrated circuit package is formed by laminating together, through sintering, a plurality of individual ceramic circuit plies, wherein each ply includes a patterned electrically conductive layer and through hole connectors, termed vias, formed in the ply for connecting the patterned electrically conductive layers of the respective plies to form a predetermined wiring circuit. In general, the individual plies have been cut from tapes prepared from very finely-divided particles of ceramic material bonded together with an organic bonding medium. Thus, in common practice, holes are punched in the tapes for the connectors, the electrically conductive layers screened onto the tapes, a predetermined number of tapes laminated together with the vias in proper registry, the laminate sintered together, and the top thereof metallized.

Table IV records a number of physical properties measured on several of the above Examples which had been fabricated into tapes in accordance with the following procedure:

Glass from each Example was ballmilled for about 24 hours utilizing $Al_2O_3$ balls to yield powder having diameter of less than 10 microns. That powder was then mixed with an organic vehicle to a solids:organic weight ratio of 3:2 in a ball mill for about 24 hours. The organic vehicle consisted primarily of a binder (polyvinyl butyral), a solvent (toluene), and a surfactant (phosphate ester). The resultant slurry was continuously applied at a thickness of about 0.005-0.02" onto a polyester film using a doctor blade and dried in air at about 25° C. to volatilize off the organic solvents. The resultant tape was cut into sheets having dimensions of about 3"×3" and 8-10 of those sheets stacked up. Upon firing for 120 minutes at 940° C., an integral composite laminate was formed having a thickness of about 0.06". The firing concurrently crystallized the glass powder in situ, thereby providing a glass-ceramic body suitable for use as a substrate for integrated circuit packaging. The recited properties were determined in accordance with conventional measuring techniques.

As employed in Table IV, density is expressed in terms of $g/cm^3$, modulus of rupture (MOR) in terms of psi, and linear coefficient of thermal expansion (Coef. Exp.) in terms of $\times 10^{-7}/°C$. The dielectric constant (D.C.) and dissipation factor (D.F.) measured at ambient temperature are also tabulated.

TABLE IV

| Property | Example 4 | Example 5 | Example 8 |
|---|---|---|---|
| Density | 3.00 | 3.13 | 2.99 |
| MOR | 25,700 | 17,700 | 20,400 |
| Coef. Exp. | 140.4 | 62.4 | 65.7 |
| D.C. | 5.08 | 5.30 | 5.14 |
| D.F. (100 KHz) | 0.004 | 0.0067 | 0.0031 |
| D.F. (2.54 GHz) | <0.001 | — | 0.001 |

As has been explained above, the inventive materials can be crystallized in situ very rapidly to bodies of high crystallinity; that is, exposure times as brief as 10-15 minutes at temperatures between about 875°-1000° C. are operable, with the entire firing cycle from ambient temperature through exposure to the crystallization temperature interval and return to ambient temperature requiring about one hour. This fast firing capability is especially desirable in the fabrication of integrated circuit packages in that crystallization can be obtained utilizing a firing schedule which is also useful with thick film inks of the types used in the commercial production of integrated circuits.

In those instances where the number of layers of tape is greater than four and/or the firing of the laminate is to be conducted in a neutral atmosphere, e.g., nitrogen, or in a reducing atmosphere, e.g., hydrogen, the laminate may, desirably be initially exposed to a temperature somewhat greater than 250° C. for a period of time adequate to insure complete removal of the organic components prior to the crystallization heat treatment.

Table V lists physical properties measured on Examples 4, 5, 6 and 8 which had been fabricated into tapes in like manner to the description above with respect to the specimens reported in Table IV, except for the crystallization firing schedule. The stacks of sheets were placed on a lehr and subjected to the following heat treating schedule:
Ambient temperature to 800° C. at about 60° C./minute
800° C. to 925° C. at about 12.5° C./minute
Hold at 925° C. for about 15 minutes
925° C. to 800° C. at about 25° C./minute
800° C. to ambient temperature at about 70° C./minute.
The total time from entry of the specimens into the lehr to removal of the specimens from the lehr was somewhat less than about one hour.

TABLE V

| Property | Example 4 | Example 5 | Example 6 | Example 8 |
|---|---|---|---|---|
| Density | 3.05 | 3.04 | 3.14 | 2.96 |
| MOR | 17,700 | 15,400 | 15,600 | 17,600 |
| Coef. Exp. | 52.2 | 26.3 | 28.2 | 21.9 |
| D.C. | 5.21 | 5.54 | 5.74 | 5.37 |
| D.F. (100 KHz) | 0.0007 | 0.0016 | 0.0011 | 0.0013 |
| D.F. (2.54 GHz) | — | — | — | 0.0015 |

Table VI reports crystal phases identified through x-ray diffractometry in Examples 4, 5, and 8. In each instance the "major" phase constituted greater than 50% by volume of the article.

TABLE VI

|  | Example 4 | Example 5 | Example 8 |
|---|---|---|---|
| Major Phase | Willemite | Willemite | Willemite |
| Intermediate Phase | Gahnite | — | Cordierite |
| Minor Phase | $MgAl_2Si_3O_{10}$ | — | — |

TABLE VI-continued

|       | Example 4 | Example 5 | Example 8 |
|-------|-----------|-----------|-----------|
| Trace | α-$Al_2O_3$ | $Mg_2B_2O_5$ | α-$Al_2O_3$ |

A comparison of the property values set out in Table IV and V clearly illustrates the rather broad ranges that are possible, most notably with respect to the linear coefficients of thermal expansion exhibited. These variations result from differences in composition and/or heat treatment which lead to different phase assemblages; e.g., the development of cordierite or gahnite crystals in addition to willemite. Hence, the generation of gahnite crystals strongly raises the overall linear coefficient of thermal expansion of the products; contrariwise, the presence of cordierite can reduce the expansion. Accordingly, by careful control of composition and heat treatment, the linear coefficient of thermal expansion can be tailored to be compatible with rather broad spectrum of materials.

We claim:

1. A glass-ceramic body exhibiting a dielectric constant less than 6 and containing willemite as the predominant crystal phase and cordierite as a secondary crystal phase, said body having a composition essentially free from $Li_2O$, $Na_2O$, and $K_2O$ and consisting essentially, expressed in terms of weight percent on the oxide basis, of 15-45% ZnO, 3-15% MgO, 10-30% $Al_2O_3$, and 30-55% $SiO_2$.

2. A glass-ceramic body according to claim 1 also containing a nucleating agent selected from the group consisting of 8-12% $ZrO_2$ and 0.001-0.05% of a noble metal selected from the group consisting of Au, Pd, and Pt.

3. A glass-ceramic body according to claim 1 also containing up to 15% total of at least one metal oxide in the indicated proportion selected from the group consisting of up to 5% $B_2O_3$, up to 5% CaO and/or SrO and/or BaO and/or PbO, up to 7% $Cs_2O$, and up to 15% MnO.

4. A thermally crystallizable glass capable of being sintered at temperatures between about 875°-1000° C. into an integral glass-ceramic body containing willemite as the predominant crystal phase and cordierite as a secondary crystal phase and exhibiting a dielectric constant less than 6, said glass being essentially free from $Li_2O$, $Na_2O$, and $K_2O$ and consisting essentially, expressed in terms of weight percent on the oxide basis, of 15-45% ZnO, 3-15% MgO, 10-30% $Al_2O_3$, and 30-55% $SiO_2$.

5. A thermally crystallizable glass according to claim 4 also containing a nucleating agent selected from the group consisting of 8-12% $ZrO_2$ and 0.001-0.05% of a noble metal selected from the group consisting of Au, Pd, and Pt.

6. A glass according to claim 4 also containing up to 15% total of at least one metal oxide in the indicated proportion selected from the group consisting of up to 5% $B_2O_3$, up to 5% CaO and/or SrO and/or BaO and/or PbO, up to 7% $Cs_2O$, and up to 15% MnO.

7. A substrate for integrated circuit packaging consisting of a glass-ceramic material exhibiting a dielectric constant less than 6 and containing willemite as the predominant crystal phase and cordierite as a secondary crystal phase, said glass-ceramic material having a composition essentially free from $Li_2O$, $Na_2O$, and $K_2O$ and consisting essentially, expressed in terms of weight percent on the oxide basis, of 15-45% ZnO, 3-15% MgO, 10-30% $Al_2O_3$, and 30-55% $SiO_2$.

8. A substrate according to claim 7 wherein said glass-ceramic also contains a nucleating agent selected from the group consisting of 8-12% $ZrO_2$ and 0.001-0.05% of a noble metal selected from the group consisting of Au, Pd, and Pt.

9. A substrate according to claim 7 wherein the composition of said glass-ceramic also contains up to 15% total of at least one metal oxide in the indicated proportion consisting of up to 5% $B_2O_3$, up to 5% CaO and/or SrO and/or BaO and/or PbO, up to 7% $Cs_2O$, and up to 15% MnO.

* * * * *